United States Patent
Zhang et al.

(10) Patent No.: US 7,941,718 B2
(45) Date of Patent: May 10, 2011

(54) ELECTRONIC DEVICE TESTING SYSTEM

(75) Inventors: Zaifu Zhang, Austin, TX (US); Robert Bailey, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1073 days.

(21) Appl. No.: 11/369,648

(22) Filed: Mar. 7, 2006

(65) Prior Publication Data
US 2007/0214398 A1 Sep. 13, 2007

(51) Int. Cl.
*G01R 31/28* (2006.01)
(52) U.S. Cl. .............. 714/728; 714/726; 714/738
(58) Field of Classification Search .............. 714/728, 714/732, 733, 734, 736, 738, 739, 30, 724–726, 714/729; 716/4
See application file for complete search history.

(56) References Cited

U.S. PATENT DOCUMENTS

| | | | | |
|---|---|---|---|---|
| 5,574,733 A * | 11/1996 | Kim | .......................... | 714/728 |
| 5,991,898 A * | 11/1999 | Rajski et al. | ..................... | 714/30 |
| 5,991,909 A * | 11/1999 | Rajski et al. | ................. | 714/729 |
| 6,041,429 A * | 3/2000 | Koenemann | .................. | 714/738 |
| 6,148,425 A * | 11/2000 | Bhawmik et al. | ............. | 714/726 |
| 6,807,646 B1 * | 10/2004 | Williams et al. | ............. | 714/736 |
| 7,155,648 B2 * | 12/2006 | Jas et al. | ........................ | 714/726 |
| 7,228,478 B2 * | 6/2007 | Swaminathan | ............... | 714/738 |
| 7,346,823 B1 * | 3/2008 | Maheshwari et al. | ........ | 714/733 |
| 7,484,151 B2 * | 1/2009 | Balakrishnan et al. | ....... | 714/728 |
| 2002/0093356 A1* | 7/2002 | Williams et al. | ............. | 324/765 |

OTHER PUBLICATIONS

Al-Yamani et al., "Bist Reseeding with Very Few Seeds," Proceedings of the 21st IEEE VLSI Test Symposium (VTS '03), IEEE Computer Society 2003, 6 pages.
Al-Yamani et al., "Built-in Reseeding for Serial Bist," Proceedings of the 21st IEEE VLSI Test Symposium (VTS '03), IEEE Computer Society 2003, 6 pages.
Lai et al., "A Reseeding Technique for LFSR-Based BIST Applications," Proceedings of the 11th Asian Test Symposium (ATS '03), IEEE Computer Society 2002, 6 pages.
Chiusano et al., "On Applying the Set Covering Model to Reseeding," IEEE 2001, pp. 156-160.
Hellebrand et al., "Built-in Test for Circuits with Scan Based on Reseeding of Multiple-Polynomial Linear Feedback Shift Registers," IEEE Transactions on Computers, vol. 44, No. 2, Feb. 1995, pp. 223-233.
Hellebrand et al., "Generation of Vector Patterns Through Reseeding of Multiple-Polynomial Linear Feedback Shift Registers," IEEE International Test Conference 1992, pp. 120-128.
Hellebrand et al., "Pattern Generation for a Deterministic BIST Scheme," IEEE 1995, pp. 88-94.
Kalligeros et al., "A New Reseeding Technique for LFSR-based Test Pattern Generation," IEEE 2001, pp. 80-86.
Kalligeros et al., "A ROMless Reseeding Scheme for Scan-based BIST," Proceedings of the 11th Asian Test Symposium (ATS '02), IEEE Computer Society 2002, 6 pages.
Krishna et al., "Reducing Test Data Volume Using LFSR Reseeding with Seed Compression," ITC International Test Conference, IEEE 2002, Paper 11.3, pp. 312-330.

(Continued)

*Primary Examiner* — Phung M Chung

(57) ABSTRACT

A method and system for testing an electronic device is disclosed. The method includes loading a first test into a test pattern generator of a first device and generating a first test pattern at the test pattern generator. A second test seed is loaded into the test pattern generator while the first test pattern is being generated. In one embodiment, the state of the test pattern generator is modified based upon the second test seed, and the first test seed.

16 Claims, 5 Drawing Sheets

OTHER PUBLICATIONS

Krishna et al., "Test Vector Encoding Using Partial LFSR Reseeding," ITC Interanational Test Conference, IEEE 2001, Paper 31.3, pp. 885-893.

Volkerink et al., "Efficient Seed Utilization for Reseeding Based Compression," Proceedings of the 21st IEEE VLSI Test Symposium (VTS'03), IEEE 2003 Computer Society, 6 pages.

Dr. Bernd Konemann, "LFSR-Coded Test Patterns for Scan Designs," pp. 1-9.

Birgit Reeb et al., "Deterministic Pattern Generation for Weighted Random Pattern," 1996, IEEE, pp. 30-36.

E. Kalligeros et al., "A ROMless LFSR Reseeding Scheme for Scan-based BIST," 2002, IEEE, 6 pages.

* cited by examiner

US 7,941,718 B2

ELECTRONIC DEVICE TESTING SYSTEM

FIELD OF THE DISCLOSURE

The present disclosure relates to electronic devices and more particularly to testing of electronic devices and methods.

BACKGROUND

Testing electronic devices, such as integrated circuits, can be an important stage in manufacturing these devices. In particular, before an integrated circuit is sold, or otherwise placed in a user environment, the circuit is tested to ensure that it operates according to its design parameters to assure that it will function for its intended purpose. Testing of an integrated circuit can take place using a variety of techniques. For example, an integrated circuit may be tested at a high level by applying signals to the input pins of the device that are representative of expected operating conditions of the device. This can ensure that the device responds appropriately under simulated operating conditions. In addition, an integrated circuit may be tested at a lower level by using design and test techniques that allow internal circuits to be controlled and monitored more directly, such as through the use of scan test techniques.

One testing method includes using a tester to apply a series of test vectors simulating actual operating conditions to the inputs of a device under test and determining whether an expected response is provided to the outputs of the device. Another testing method includes using the tester to apply a series of random, or pseudo-random, test vectors to the device under test that are generated at the tester using a seed value. While these test vectors are not necessarily representative of actual operating conditions of the device under test, their application does produce expected results, which can be compared to actual results to determine whether or not the device under test is operational.

Because an integrated circuit can include millions of logic devices, verifying the integrity of each individual device can be difficult and can require a large number of test vectors. One limitation of testing a device by applying pseudo-random test vectors to the device is that all logic devices may not be tested, because the particular test vector sequence only provides observability to a certain percentage of the logic devices. Therefore, additional test vectors may need to be identified to test the untested portion of the integrated circuit. By applying the additional test vectors, a more complete testing of the integrated circuit can be realized. However, the application of the additional test vectors generally requires additional memory space to store them. While the cost of additional memory space in a tester may be acceptable, given its relative costs, such additional memory space is typically not available to a device using built in self test circuitry (BIST circuitry).

Accordingly, there is a need for an improved system and method to test an electronic device.

BRIEF DESCRIPTION OF THE DRAWINGS

The present disclosure may be better understood, and its numerous features and advantages made apparent to those skilled in the art by referencing the accompanying drawings.

DESCRIPTION OF THE DRAWINGS

A method and system for testing an electronic device is disclosed. The method includes loading a first test seed into a test pattern generator of a first device and generating a first set of test patterns at the test pattern generator. A second test seed is loaded into the device while the first set of test patterns is being generated. In one embodiment, the state of the test pattern generator, which is based on the first test seed, is modified based upon the second test seed.

A device is disclosed that includes a first register to receive a test seed, and a test pattern generator to provide test patterns based on a test seed received from the first register. The device also includes an input to receive a seed indication signal to indicate availability of a seed at the first register. The seed indication signal can be received while the test pattern generator is generating a first test pattern.

Figure 1:
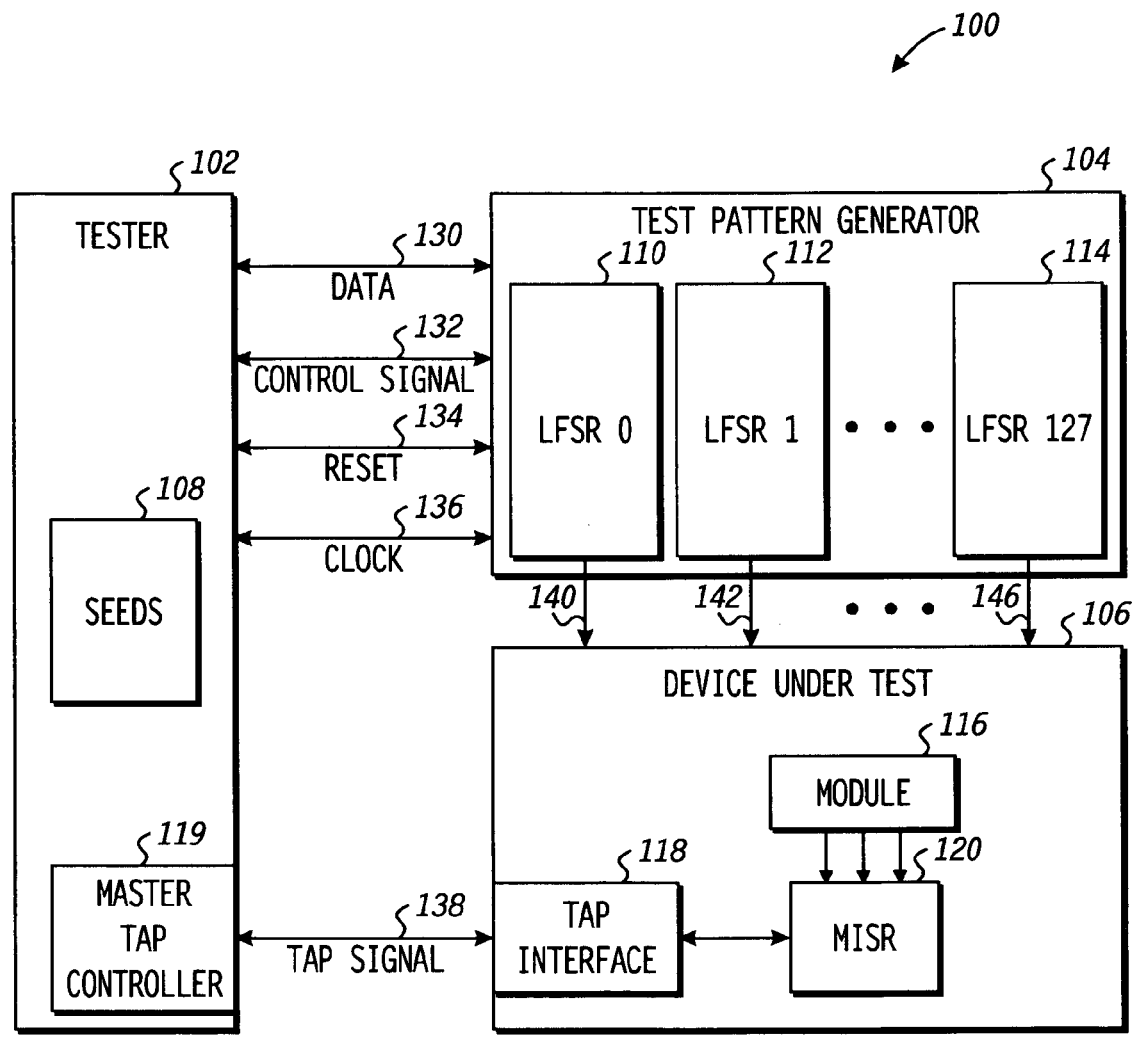
FIG. 1 is a block diagram of a particular embodiment of an electronic device testing system.

Referring to FIG. 1, a particular embodiment of an electronic device to test an integrated circuit is illustrated. The device of FIG. 1 is a testing system that includes a tester 102, an integrated circuit device 104, and a device under test 106. The tester 102 has a memory 108 that stores a first set of seeds 109. The tester 102 also includes input/output nodes to receive and provide data 130, control signal 132, reset signal 134 and clock 136. A master TAP controller 119 that is implemented using a subset of the input/output nodes of the tester 102 communicates with the device under test 106 via a tap signals bus 138 that is implemented using a subset of the input/output nodes of the tester 102.

The integrated circuit device 104 includes test pattern generators that include a first linear feedback shift register LFSR 110, a second LFSR 112, through a $128^{th}$ LSFR 114. The device under test 106 includes a functional module 116, a TAP interface 118 and a multiple input signature register (MISR) 120.

In one embodiment, the integrated circuit device 104 is coupled to the tester 102 via a variety of communication buses. The communication buses include a data bus 130, a control bus 132 and a clock bus 136. In addition, the device under test 106 is coupled to the tester 102 via a TAP signals bus 138, which can be a subset of the data bus 130, control bus 132, and clock bus 136. Further, the device under test 106 is coupled to the test pattern generator via a variety of test lines, including a first test line 140, a second test line 142 through a $128^{th}$ test line 146.

During operation, the tester 102 provides the seeds 109 to the integrated circuit device 104. The integrated circuit device 104 uses the seeds 109 to generate a series of pseudo-random numbers at the LFSRs 110-114 that form test vectors to be applied at the device under test 106. The device under test 106, when properly manufactured, will respond to the received test vectors in an expected manner. In the embodiment illustrated, the expected manner of operation will result in an expected value being accumulated at the MISR 120, which interfaces to the tester 102 via the TAP signals bus 138, to verify proper functionality.

The seeds 109 are associated with a testing scheme for the device under test 106. The seeds 109 may include a first set of seeds that were randomly selected and used to generate a known set of pseudo-random test vectors associated with pseudo random testing of the device under test 106. The seeds 109 may also include a second set of seeds that were deterministically derived to generate a predetermined set of test vectors. The second set of seeds are chosen so that, when the seeds are provided to the test pattern generator 104, the predetermined or desired test vectors are generated and applied to the device under test 106. In one embodiment, these desired test vectors were chosen because they test specific portions of the device under test 106 that were not fully tested by the pseudo-random test vectors generated by the randomly selected seeds. Thus, the seeds 109 are chosen to test more of the logic devices comprising the device under test 106 than were tested by the pseudo-random test vectors.

By applying the seeds 109 to the test pattern generator of integrated circuit device 104, a known set of test vectors is generated using pseudo-random number generation techniques. Thus, the disclosed system allows for testing of the device under test 106 through both application of randomly selected seeds and through application of derived seeds.

The use of both randomly selected seeds and derived seeds has many advantages depending upon the specific embodiment of the device to which they are applied. With respect to FIG. 1, in an embodiment where tester 102 is a tester of the type being used on a test floor, the cost and complexity of tester 102 can be greatly reduced by providing seeds to the test pattern generator of integrated circuit device 104, which is part of a test fixture that interfaces with tester 102 and the device under test 106. By providing a separate device of the integrated circuit device, such as an integrated FPGA device, integrated at a mother or daughter board of the test fixture, the amount and rate of information that needs to pass between the tester and the test fixture containing integrated circuit device 104 is greatly reduced. For example, instead of having to provide tens of thousands of test vectors, each vector having possibly thousands of bits, between tester 102 and a test fixture where device under test 106 is tested, the amount of data that needs to pass between the tester 102 and the test fixture 104 is reduced to merely test seeds themselves. Because each test seed can generate many hundreds, or even thousands of data bits for test vectors, the amount of data that needs to be communicated between the tester 102 and integrated circuit device 104 is greatly reduced in quantity, as is the rate at which the data needs to be communicated between the tester 102 and test pattern generator 104. In this configuration, the device under test 106 can be a semiconductor device formed at a different substrate than integrated circuit device 104.

In a similar, but alternate embodiment, the tester 102 and integrated circuit device 104 can represent control circuitry residing at a common integrated circuit device that also includes the device under test 106. In this embodiment, the tester 102 represents BIST (Built-In Self Test) circuitry residing at a common integrated circuit substrate as the LFSRs 110-114 and device under test 106.

In one embodiment, the tester 102 has a plurality of input/output (I/O) connections illustrated as connected to integrated circuit device 104 and device under test 106. The connections between the tester 102 and integrated circuit device 104 include data connections over which data 130 can be communicated, control connections over which control signal 132 are communicated, and clock connections over which clock 136 can be communicated. The tester 102 is further illustrated to provide the clock 136 to the device under test 106. In addition, the tester 102 interfaces with the device under test 106 in order to access information through the tap interface. Though illustrated as a separate connection through which tap signals 138 are communicated to the tester, it would be appreciated that the connections and signals between tester 102 and test pattern generator 104 can be shared to access the tap interface 118 of device under test. The use of derived seeds in this manner is advantageous, in that memory space is typically not available on an integrated circuit to contain large numbers of test vectors needed to thoroughly test the chip.

To provide the seeds 109 to the LFSR's 110-114, the tester 102 may serially shift each of the seeds 109 via the data bus 130. The integrated circuit device 104 may store each received seed prior to being provided to a corresponding LFSR 110. In this manner the test pattern generator 104 may receive up to 128 test seeds, one for each LFSR.

In addition, the tester 102 may provide control signals to the test pattern generator at integrated circuit device 104 via the control signals bus 132. This allows the tester 102 to control the operation of the test pattern generator at integrated circuit device 104. For example the tester 102 may provide control signals to indicate when to begin a testing operation, suspend a testing operation, end a testing operation, or other appropriate action. In addition, the tester 102 may apply a control signal to the test pattern generator 104 to provide new test seeds to the test pattern generator 104, while the test pattern generator of integrated circuit device 104 continues to generate data for test vectors that will test the device under test 106.

The tester 102 may also supply a reset signal to the test pattern generator of integrated circuit device 104 via the reset bus 134. The reset signal may indicate to the that the contents of the test pattern generator, i.e., LFSR's 110-114 should be reset to a reset state. The reset operation may occur prior to applying a seed to the LFSR. Further, the tester 102 may supply clock signals to the test pattern generator of integrated circuit device 104 and the device under test 106 via the clock bus 136. By providing a common clock signal synchronized testing operations are possible.

Each of the LFSRs of integrated circuit device 104 generates a pseudo-random output value based on received seeds. These pseudo-random outputs values can be applied as test vectors to scan-in test input pins of the device under test 106 via the test lines 140, 142, through 146. In addition, each of the LFSRs 110-114 may continue to receive additional seeds from the tester 102 while generating test patterns for the device under test 106. These new seeds are preloaded, and can be used to update the existing state of an LFSR during operation, i.e. on the fly. This provides for the use of derived seed values and more efficient testing of the device under test 106. The LFSRs may be reseeded multiple times in order to produce a desired set of values that form test vectors. In addition, because a test seed can be applied to an LFSR without resetting the LFSR, the test seed can be based upon the expected state of the test pattern generator when the seed is applied.

The device under test 106 applies the received test vectors generated by the test pattern generator of integrated circuit device 104 to test module 116. Output responses of the module 116, which are based on the applied test vectors, are provided to the MISR 120. The MISR 120 may combine the received output response to create a signature to verify functionality of module 116. Further, the MISR 120 may receive a signature from the tester 102 via the TAP signals bus 138. The signature provided by the tester 102 may be compared to the signature generated by the MISR 120 to determine if module 116 is operating as expected. The result of this comparison can be transmitted to the tester 102 via the TAP interface 118.

The MISR 120 may generate intermediate test results based on the test response generated by the test patterns received by the device under test 106. These intermediate test results may be provided to the tester 102 via the TAP interface 118. These intermediate results may be analyzed to determine if the test procedure is functioning properly, to perform system diagnostics, or to develop other appropriate test responses. The MISR 120 may also provide a final test result to the tester 102.

Figure 2:
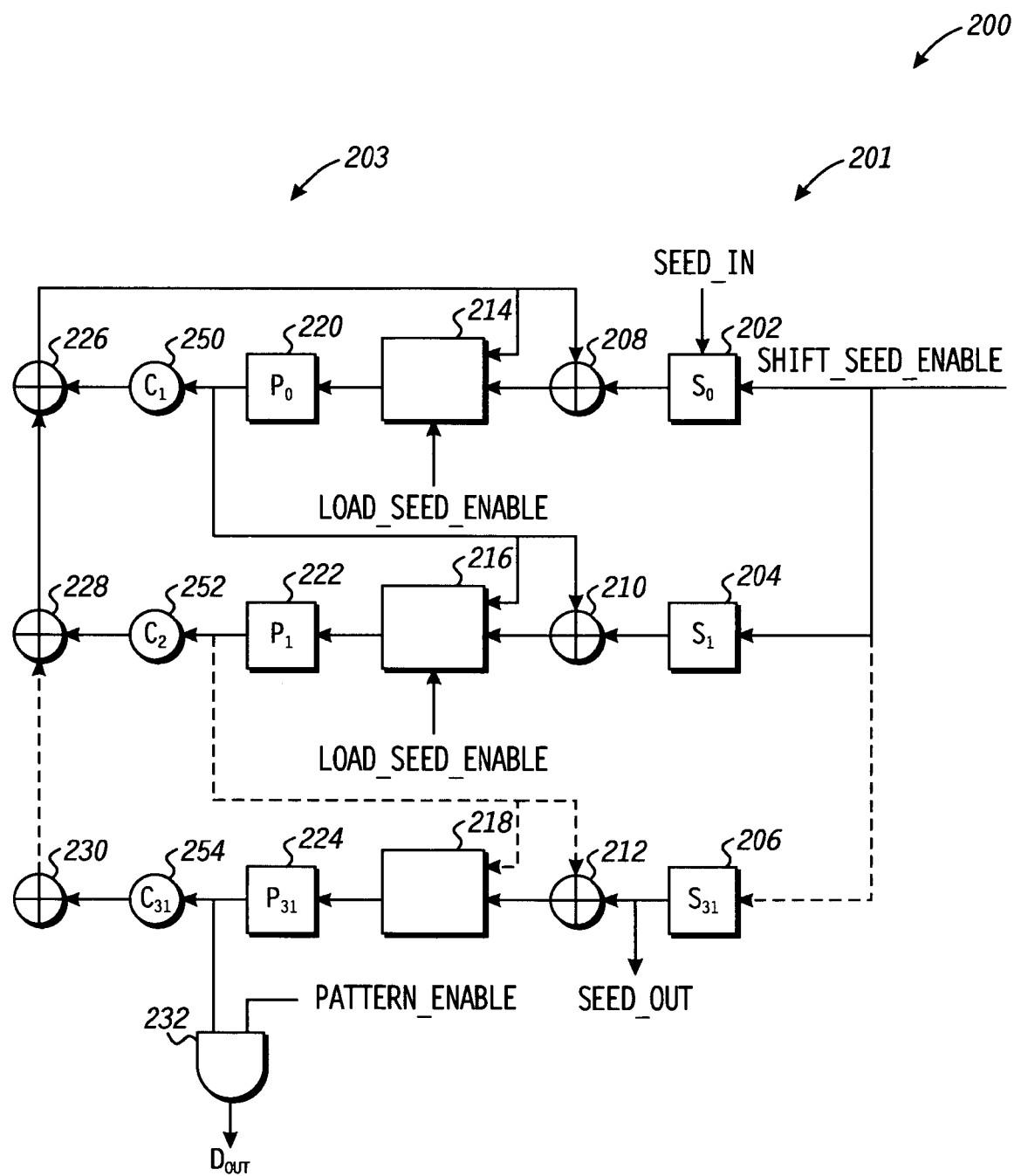
FIG. 2 is a block diagram of a particular embodiment of the linear feedback shift register (LFSR) illustrated in FIG. 1.

Referring to FIG. 2, a particular embodiment of an LFSR device 200 that may be used in conjunction with the testing system of FIG. 1 is illustrated. The LFSR device 200 includes a seed register 201 and a pattern generator module 203. The seed register 201 includes a first latch 202, a second latch 204, and latches through a $32^{nd}$ latch 206 (latches 202-206). The register 202 includes a control input labeled "shift enable" and a data input labeled "seed_in."

Each of the latches 202-206 has an input connected to receive a signal label shift_seed_enable, a second input to receive data, and an output. Latch 202, which is the first latch in the register 201, has a second input connected to receive a signal which would typically represent information being received from the tester. Each subsequent latch element is connected to the output of the previous latch element (not shown).

The pattern generator module 203 includes a plurality of stages. Each stage corresponds to one of the latches of register 201. A first stage associated with latch 202 includes an exclusive OR gate 208 having a first input connected to the output of latch 202, a second input, and an output. This stage further includes a multiplexer 214 comprising a first input connected to the output of exclusive OR gate 208, a second input, and output, and an input to receive a signal labeled load_seed_enable. The latch 220 of the stage has an input connected to the output of the multiplexer 214, an output, and a latching signal (not illustrated). The stage further includes a coefficient module 250 comprising a first input connected to the output of the latch 220, and an output. In addition, the stage includes an exclusive OR gate 226 comprising a first input connected to the output of the coefficient module 250, a second input, and an output connected to the second input of the multiplexer 214 and to the second input of the exclusive OR gate 208.

The second stage of the pattern generator 203 associated with latch 204 has a similar connectivity to that described with respect to the first stage associated with latch 202. However, the second input of multiplexer 216 of the second stage and the second input of the exclusive OR gate 210 are connected to the output of latch 220 from the first stage, while the output of the exclusive OR gate 228 is connected to the second input of the exclusive OR gate 226 of the first stage. Latch 222 corresponds to latch 220 of the first stage, while coefficient module 252 corresponds to coefficient module 250. Subsequent stages are connected in the similar manner as the stage associated with the latch 204. For example, the last stage of the pattern generator 203 includes an XOR gate 212, multiplexer 218, a latch 224, a coefficient module 254, and an XOR gate 230 configured in a similar manner to the first stage as described above, and connected to latch 206 of the register 201.

An AND gate 232 of the pattern generator module 203 includes a first input connected to the output of the latch 224, and a second input to receive a signal labeled pattern_enable, an output label DOUT to provide a data output signal.

During operation, seeds are loaded into the register 201. In a particular embodiment, a seed is shifted into the register by asserting the shift_seed_enable control signal to shift the data from one latch to another. In one embodiment, the contents of the latch 206 can be shifted out through the seed_out output to other latches (not illustrated). Alternatively, each LFSR's register can be addressed separately.

After a seed has been shifted into the register 201, the seed may be applied to the pattern generation stage 203 by asserting the load_seed_enable signal. When the load_seed_enable_signal is asserted the outputs of the XOR gate 208, XOR gate 210, through XOR gate 212 are selected at the corresponding multiplexers 214, 216, through 218 and latched to the corresponding latches 220, 222, through 224 (latches 220 through 224).

When the load_seed_enable signal is deasserted, the pattern generator stage 203 may generate pseudo-random patterns based on the contents of the latches 220, 222, through 230. The contents of these latches are applied to the coefficient modules 250, 252, through 254 (250 through 254). The coefficients $C_1$, $C_2$, through $C_{31}$ are applied to the contents of the latches, and the results are provided to the pattern generation gates 226, 228, through 230 (226 through 230). In a particular embodiment, the value of the coefficients may either be a "zero" or "one" value, and the coefficient modules may be implemented as switches.

Further, the output of each stage's exclusive or gate is fed back to itself as indicated. In addition, the outputs of each latch preceding the coefficient modules are applied to the succeeding stage when the load_seed_enable signal is deasserted. For example, the output of the latch 220 is applied to the latch 222 via the multiplexer 216. Repeated application of the contents of the latches to the coefficient modules 250 through 254 and the outputs of the multipliers to the pattern generation gates 226 through 230 results in generation of a pseudo-random number stored in the latches 220 through 224. This random number may be shifted out via the output gate 232 by asserting the pattern enable signal.

Figure 3:
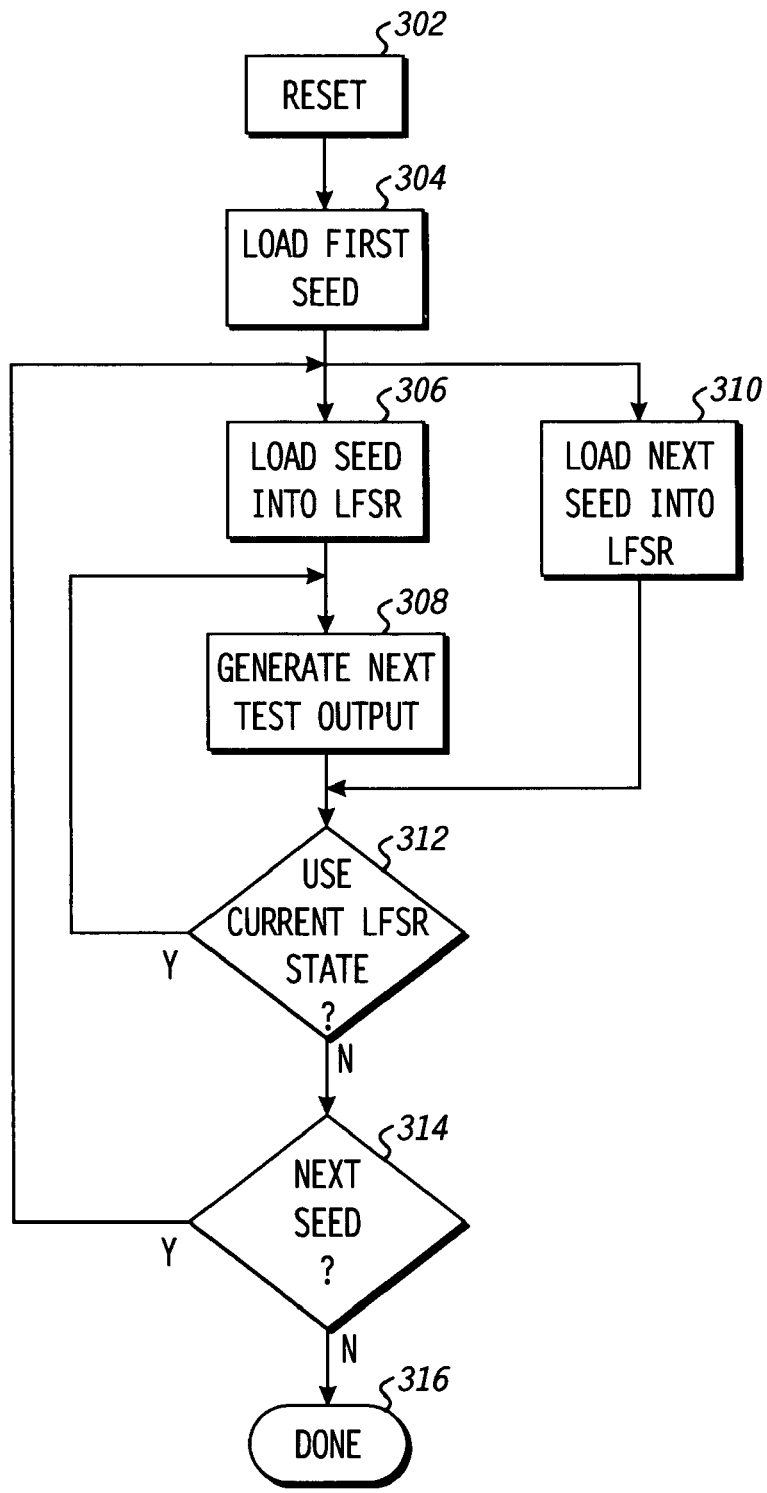
FIG. 3 is a flow chart of a method of providing a test to a testing in accordance with a specific embodiment of the present disclosure.

Referring to FIG. 3, a flow chart of a method for generating a test pattern is illustrated. At block 302 a reset signal is received. The reset signal may be received by a test pattern generator, such as the test pattern generator 104. The reset signal may clear the registers and latches of the test pattern generator, as well as initiate other reset procedures.

At block 304 a first test seed is loaded into a pre-load register for an LFSR. The first test seed can be associated with a test pattern that will be used to test portions of a device under test. As explained with reference to FIG. 1, a test seed can be randomly selected or derived. The test seed may be loaded in a parallel or serial fashion.

At block 306 the test seed is loaded into an LFSR from the register. In one embodiment, an arithmetic operation is performed on the test seed and a current state of the LFSR to generate a new state of the LFSR from which the LFSR will operate. The LFSR is designed to produce a psuedo-random bit stream based on the test seed.

At block 308, the next test output is generated by the LFSR by clocking the LFSR to produce a next pseudo-random output value. This pseudo-random value corresponds to one bit of a test vector for the device under test. The LFSR may generate one bit of a test vector to be applied in parallel to a device under test with other bits generated at other LFSRs, or the LFSR can generate an entire test vector serially, such as a scan test vector, one bit at a time.

In addition, referring to block 310, another seed may be loaded into the preload register for LFSR at the same time the LFSR is generating test outputs at 308.

Moving to decision block 312, the test pattern generator determines whether the LFSR should continue to operate on its current state, or whether a preloaded seed should be used. If the LFSR has not finished generating the desired number of test bits from the current seed, the current state of the LFSR is maintained and the method returns to block 308 to generate further test bits. If a desired number of test bits has been generated from the current seed, the method moves to decision block 314, and it is determined whether another seed is available to be loaded into the test pattern generator. If there is another seed available, the method returns to block 306 where the next test seed is used to set the LFSR at a new state to continue generating test vectors. If there are no more test seeds available, the method ends at block 316.

Figure 4:
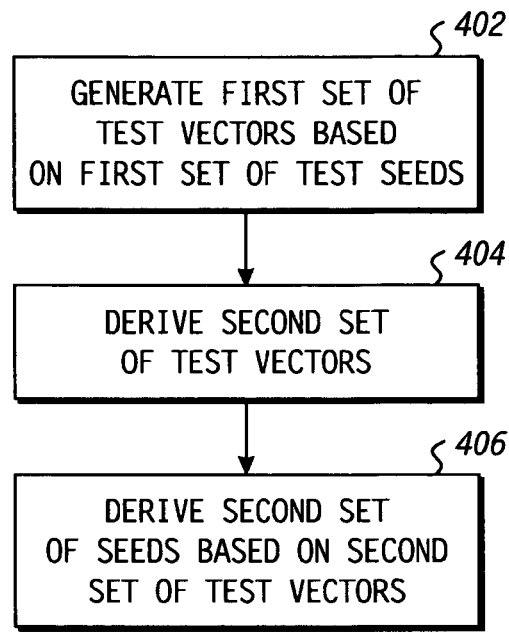
FIG. 4 is a flow chart of a method of determining a set of test vectors for use in a testing in accordance with a specific embodiment of the present disclosure.

Referring to FIG. 4, a method of generating a plurality of test vectors is illustrated. At block 402 a first set of test vectors are generated based on a first set of test seeds. The first set of test vectors can be generated through a variety of techniques, such as using a random selection of the first set of test seeds.

Moving to block 404, a second set of derived test vectors are generated. The second set of derived test vectors can be generated by determining what portions of a device are not tested by the first set of test vectors. The second set of test vectors may be determined using automated test pattern generators (ATPG) or other appropriate techniques. As discussed further herein, test seeds can be derived to generate the second set of test vectors.

Proceeding to block 406, a second set of seeds is derived based on the second set of test vectors. The second set of seeds may derived so that, when the seeds are applied to a test pattern generator, such as an LFSR, the second set of test vectors is generated. The second set of test vectors may be generated by the same device that generates the first set of test vectors.

Figure 5:
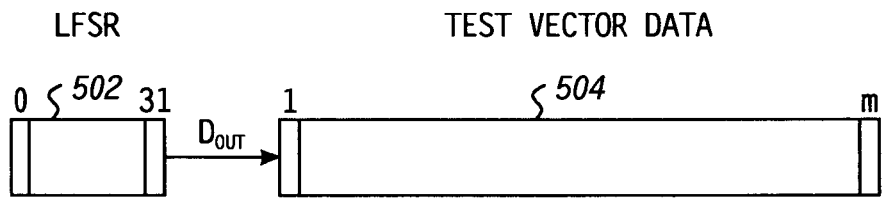
FIG. 5 is a diagram of a transformation of an LFSR seed value is illustrated in accordance with a specific embodiment of the present disclosure.

Referring to FIG. 5, a diagram of a transformation of an LFSR seed value is illustrated. The diagram illustrates an LFSR 502 and a test vector 504. The LFSR 502 is associated with a primitive polynomial that determines the number generated by the LFSR for a particular seed value. For example, in a particular embodiment, the characteristics of an LFSR may be associated with a primitive polynomial set forth in the following formula:

$$F(X) = X^{32} + c_{31}X^{31} + c_{30}X^{30} + \ldots + c_1X^1 + 1$$

where $c_{31}$, $c_{30}$, and other coefficients are the coefficients applied by the LFSR, as described with respect to FIG. 2. Accordingly, the test vector 504 produced by the LFSR may be expressed by the following formula:

$$\begin{bmatrix} P_0[q] \\ P_1[q] \\ \ldots \\ P_{31}[q] \end{bmatrix} = \begin{bmatrix} 1 & c_1 & \ldots & c_{30} & c_{31} \\ 0 & 1 & \ldots & 0 & 0 \\ \ldots & \ldots & \ldots & \ldots & \ldots \\ 0 & 0 & \ldots & 1 & 0 \end{bmatrix}^q \begin{bmatrix} S_0 \\ S_1 \\ \ldots \\ S_{31} \end{bmatrix} = C^q S0$$

where the matrix C is the companion matrix for the LFSR, the values of P represent the state of the LFSR, q represents the number of states that have been propagated through the LFSR 502, and the S0 is the initial state or seed of the LFSR 502. In addition, the value Dout can be obtained by the following formula:

$$Dout[q] = P_{31}[q] = [C^q S0]_{32}$$

Therefore, if a desired set of test vector test bits has been identified, the seed associated with that test vector may be determined by solving the above formula for the values of S. For example, Gaussian-Jordan elimination may be used to solve for the S values.

Figure 6:
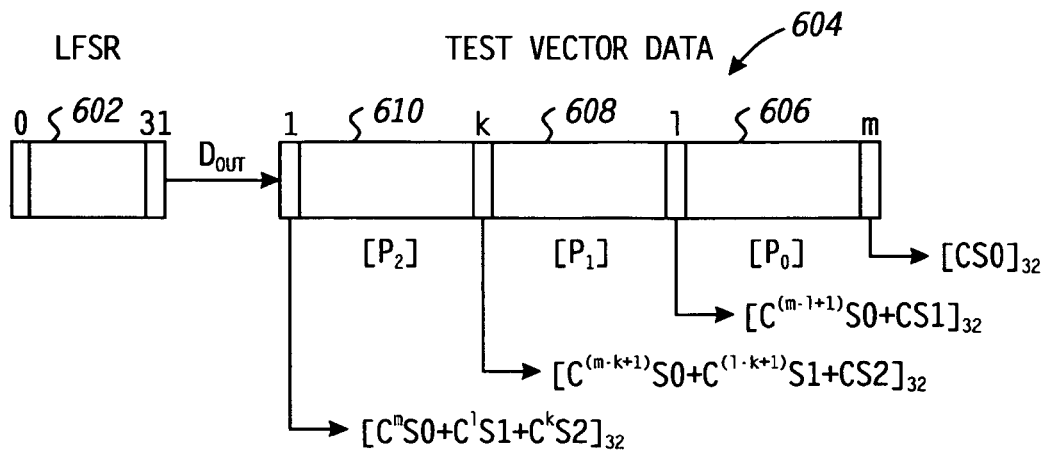
FIG. 6 is a diagram illustrating reseeding of an LFSR to produce a test vector in accordance with a specific embodiment of the present disclosure.

Referring to FIG. 6, a diagram illustrating reseeding of an LFSR to produce a test vector bits is shown. The diagram illustrates an LFSR 602 and a set of test vector bits 604. The test vector bits 604 includes a first set of sub-vector bits 606 ($P_0$), a second set of vector bits 608 ($P_1$) and a third set of sub-vector bits 610 ($P_2$). Each set of sub-vector bits is associated with a new seed provided to the LFSR. Accordingly, in the illustrated embodiment, three seeds (S0, S1, and S2) are used to produce the test vector bits 604. During operation, the seed S0 is initially applied to the LFSR 602. At predetermined times, the LFSR 602 is reseeded or updated with the seeds S1 and S2. This reseeding procedure may be useful when a single seed does not produce the desired test vector With an initial seed S0, and reseeding S1 and S2 at l-th and k-th moments, respectively, the following matrix equation represents the relation between the test vector 604 and the three seeds S0, S1, and S2:

$$\begin{bmatrix} [P_0] \\ [P_1] \\ [P_2] \end{bmatrix} = \begin{bmatrix} [A_{00}] & [0_{01}] & [0_{02}] \\ [A_{10}] & [A_{11}] & [0_{12}] \\ [A_{20}] & [A_{21}] & [A_{22}] \end{bmatrix} \begin{bmatrix} S0 \\ S1 \\ S2 \end{bmatrix}$$

where, $[A_{ij}]$ (i,j=1, 2, 3) is derived from CS0, CS1, CS2, $C^2$S1, $C^2$S1, ..., $C^{m-1}$S0, $C^{l-1}$S2, $C^m$S0, $C^l$S1, $C^k$S2. Accordingly, the values of S0, S1, and S2 may be determined by solving the above matrix equation for these values. In addition, the LFSR may be reseeded any number of times in order to produce the desired test vector.

Figure 7:
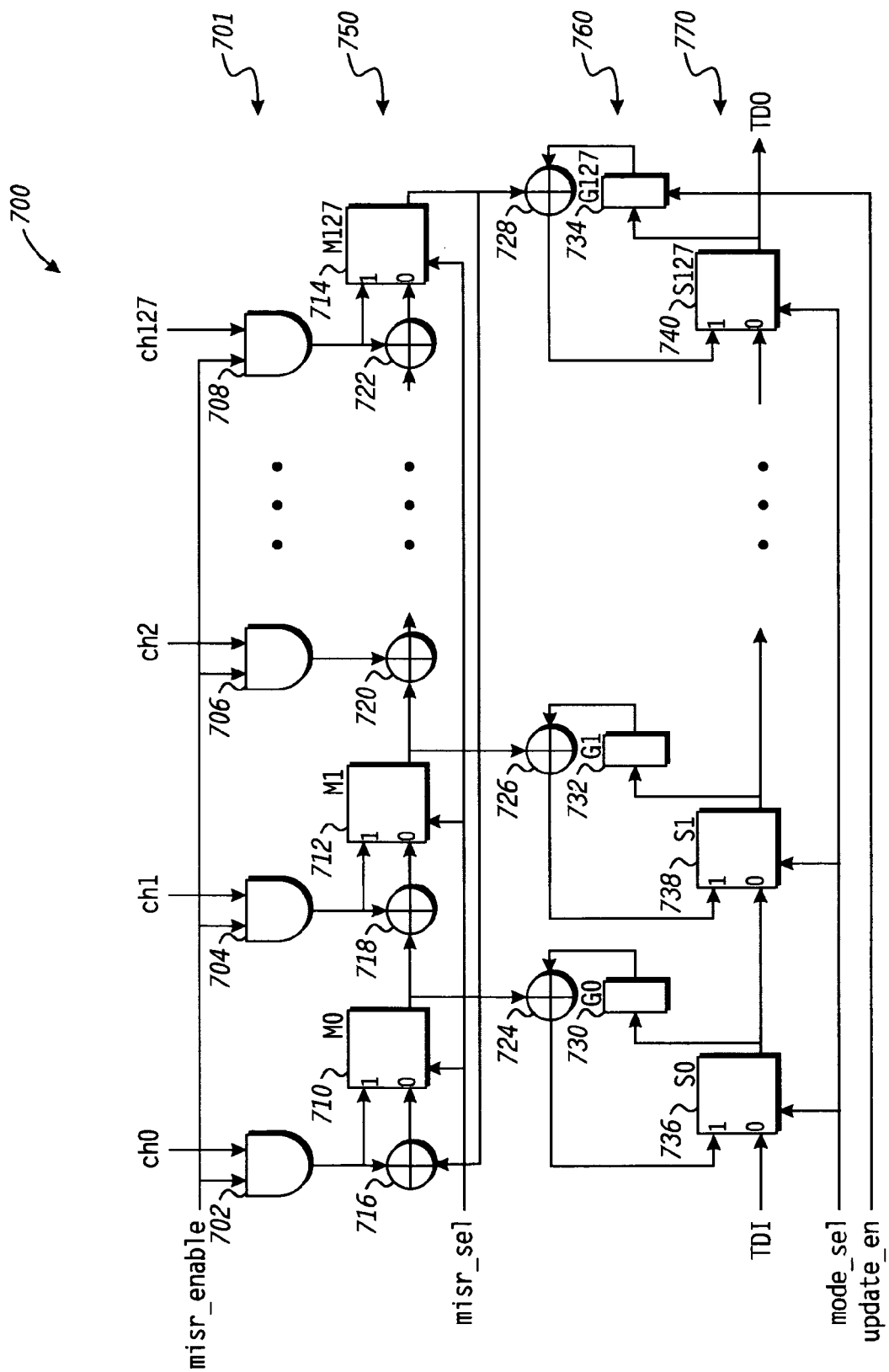
FIG. 7 is a block diagram of a particular embodiment of a MISR for use in a testing system, such as the electronic device testing system illustrated in FIG. 1 in accordance with a specific embodiment of the present disclosure.

Referring to FIG. 7, a block diagram of a particular embodiment of a MISR 700 is illustrated. The MISR 700 includes a MISR enable stage 701 and a MISR register 750. The MISR enable stage includes a number of logic gates, including a first AND gate 702, a second AND gate 704, a third AND gate 706, and additional AND gates through a $128^{th}$ AND gate 708 (AND gates 702-708). The first AND gate 702 includes a first input to receive a signal labeled "misr_enable", a second input to receive a first bit of a data word, the first bit labeled "ch0", and an output. The other AND gates are configured in similar fashion to receive the signal misr_enable as well as additional bits of the data word.

The MISR register 750 includes a number of latches, including a first latch 710, a second latch 712, and additional latches through a $128^{th}$ latch 714. The first latch 710 includes a first data input connected to the output of the first AND gate 702, a second data input, a control input to receive a signal labeled "misr_sel", and an output. The MISR register 750 also includes XOR gates 716, 718, 720, through a $128^{th}$ XOR gate 722 (XOR gates 716-722). The first XOR gate 716 includes a first input connected to the output of the first AND gate 702, a second input, and an output connected to the second data input of the latch 710. The remaining latches and XOR gates are connected in a similar fashion as the first XOR gate 716 and the first latch 710, with an input of each succeeding XOR gate connected to the output of the preceding latch. In addition, an output of the $128^{th}$ latch 714 is connected to the second input of the first XOR gate 716. The latches 710-714 may also feed the input of the XOR gate 716 to ensure that the characteristic of the MISR implementation is associated with a primitive polynomial.

The MISR 700 also includes a signature register 760, having a number of signature register latches, including a first signature register latch 730, a second signature register latch 732, and additional latches through a 128$^{th}$ signature register latch 734. The signature register 760 also includes a number of XOR gates, including a first XOR gate 724, a second XOR gate 726, and additional XOR gates through a 128$^{th}$ XOR gate 728 (XOR gates 736-740). The first signature register latch 730 includes a data input, a control input to receive a signal labeled "update_en", and an output. The first XOR gate 724 includes a first input connected to the output of the latch 710, a second input connected to the output of the signature register latch 730 and an output. The remaining latches and XOR gates of the signature register 760 are configured in a similar fashion.

The MISR 700 also includes an output register 770. The output register includes a number of latches, including a first output register latch 736, a second output register latch 738, and additional latches through a 128$^{th}$ output register latch 740. The first output register latch 736 includes a first data input connected to the output of the XOR gate 724 and a second data input to receive a signal labeled "TDI." The first output register latch 736 also includes a control input to receive a signal labeled "mode_sel" and an output. The remaining output register latches are configured in similar fashion, with each succeeding output register latch including an input connected to the output of the preceding output register latch. In addition, the 128$^{th}$ output register latch includes an output to provide a signal labeled TDO.

During operation, the MISR 700 receives test results from a device under test. These test results are applied to the MISR register 750 via the AND gates 702-708 by asserting the misr_enable signal. The test results are combined with the current state of the MISR register 750 via the XOR gates 716-722, so that a result may be accumulated over time.

The signature register 760 stores a test signature. This test signature may be loaded into the output register 770 via the input signal TDI and applied to the signature register 760 by asserting the signal update_en. In addition, the contents of the signature register are applied to the XOR gates 736-740 to be logically combined with the contents of the MISR register 750. The outputs of the XOR gates 736-740 are applied to the output register 770. Accordingly, the output register 770 will contain a result of the comparison of the test result signature stored in the MISR register 750 and the signature stored in the signature register 770. The contents of the output register may be shifted out via the signal TDO by asserting the signal mode_sel.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A method, comprising:
    generating a first test pattern at a test pattern generator based on a first test seed, the test pattern generator comprising a first register comprising a first plurality of latches and a linear feedback shift register (LFSR);
    pre-loading a second test seed into the first register of the test pattern generator while the first test pattern is being generated;
    modifying a state of the LFSR based on the second test seed by applying an exclusive OR operation to the state of the LFSR and to data stored at each of the first plurality of latches while the first test pattern is being generated.

2. The method of claim 1, wherein LFSR comprises:
    a plurality of XOR gates, each of the plurality of XOR gates comprising an input coupled to an output of a corresponding latch of the first plurality of latches; and
    a second plurality of latches, each of the second plurality of latches comprising an input coupled to an output of a corresponding one of the plurality of XOR gates.

3. The method of claim 2, further comprising:
    generating a second test pattern at the LFSR based on the second test seed; and
    pre-loading a third test seed into the test pattern generator while the second test pattern is being generated.

4. The method of claim 3, further comprising modifying the state of the LFSR based on the third test seed by applying an exclusive OR operation to data stored at each of the first plurality of latches while the second test pattern is being generated.

5. The method of claim 3, further comprising:
    generating the second test pattern at the LFSR after generating the first test pattern, the second test pattern based on a last state of the LSFR and the second test seed.

6. The method of claim 3, wherein the second test seed was derived to provide a predetermined second test pattern.

7. The method of claim 6, wherein the second test seed is based upon an expected state of the test pattern generator.

8. The method of claim 6, wherein the second test seed is derived based on a Gaussian-Jordan elimination method.

9. The method of claim 1, wherein the first test pattern is generated at a first semiconductor device and further comprising:
    providing the first test pattern to a second semiconductor device, the second semiconductor device formed at a different substrate than the first semiconductor device.

10. The method of claim 1, wherein the first test pattern is generated at a first semiconductor device and further comprising:
    providing the first test pattern to a second semiconductor device, the second semiconductor device formed at a same substrate as the first semiconductor device.

11. A method, comprising:
    generating a first test pattern at a test pattern generator based on a first test seed;
    pre-loading a second test seed into the test pattern generator while the first test pattern is being generated, the second test seed derived to generate a predetermined test pattern at the test pattern generator;
    wherein the second test seed was derived by testing a first device using a first plurality of pseudo-random test patterns generated using a linear feedback shift register (LFSR) using a first set of seed values to generate a first set of test results;
    determining a first test pattern based on the first set of test results; and
    determining a second set of seed values to generate the first test pattern using the LFSR.

12. The method of claim 11, wherein the first test pattern is further generated based on the first test seed and the second test seed.

13. The method of claim 11, wherein the first test pattern is further generated based on a third test seed.

14. The method of claim 11, wherein the test pattern generator includes a linear feedback shift register (LFSR).

15. The method of claim 11, further comprising:

modifying a state of the LFSR based on the second test seed;

generating a second test pattern at the LFSR based on the modified state of the LFSR; and pre-loading a third test seed into the test pattern generator while the second test pattern is being generated.

16. The method of claim 15, further comprising:

generating the second test pattern at the LFSR after generating the first test pattern, the second test pattern based on a last state of the LSFR and the second test seed.

\* \* \* \* \*